United States Patent [19]

Mercer et al.

[11] Patent Number: 5,155,175
[45] Date of Patent: Oct. 13, 1992

[54] CROSSLINKABLE FLUORINATED POLYARYLENE ETHER COMPOSITION

[75] Inventors: Frank W. Mercer, Belmont; Timothy D. Goodman, Redwood City; Aldrich N. K. Lau, Palo Alto; Lanchi P. Vo, San Jose, all of Calif.

[73] Assignee: Intellectual Property Law Dept., Menlo Park, Calif.

[21] Appl. No.: 583,897

[22] Filed: Sep. 17, 1990

Related U.S. Application Data

[63] Continuation-in-part of Ser. No. 510,386, Apr. 17, 1990, abandoned, and a continuation-in-part of Ser. No. 510,353, Apr. 17, 1990, abandoned, and a continuation-in-part of Ser. No. 447,750, Dec. 8, 1989, abandoned.

[51] Int. Cl.⁵ .................................... C08G 65/48
[52] U.S. Cl. .................................. 525/390; 525/471; 525/534; 525/535; 525/538
[58] Field of Search ................. 525/390, 471, 534, 535, 525/538

[56] References Cited

U.S. PATENT DOCUMENTS

| | | | |
|---|---|---|---|
| 3,332,909 | 7/1967 | Famham et al. | 260/47 |
| 3,555,004 | 1/1971 | Mueller et al. | 260/181 |
| 4,272,429 | 6/1981 | Jones | 260/37 N |
| 4,732,843 | 3/1988 | Budde et al. | 430/312 |
| 4,744,007 | 5/1988 | Watari et al. | 361/386 |
| 4,835,197 | 5/1989 | Mercer | 524/538 |

FOREIGN PATENT DOCUMENTS

1282757  7/1972  United Kingdom .

OTHER PUBLICATIONS

Kellman et al., ACS Symp. Ser. 326, Phase Transfer Catalysis, p. 128 (1987).
Kellman et al., Polym. Prepr. 22(2), 383 (1981).
Gerbi et al., J. Polym. Sci. Polym. Letters Ed. 23, 551 (1985).
Denton et al., J. Electronic Mater. vol. 14, p. 119 (1985).

"Microelectronics Packaging Handbook," Tummala et al. (eds.), pp. 687–692 (van Nostrand Reinhold).

(List continued on next page.)

Primary Examiner—Harold D. Anderson

[57] ABSTRACT

A crosslinkable composition comprising:
(i) a fluorinated poly(arylene ether) comprising a repeat unit of such as

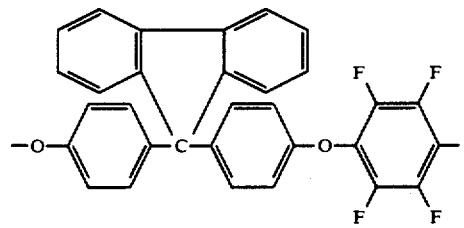

and
(ii) a bistriazene compound such as

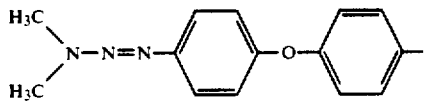

-continued

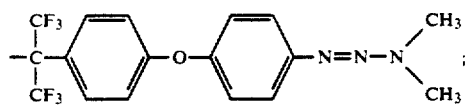

bistriazene compound (ii) being present in an amount effective to crosslink fluorinated poly(arylene ether) (i).

21 Claims, 4 Drawing Sheets

OTHER PUBLICATIONS

Labadie et al., Sampe J. vol. 25, pp. 18-22 (Nov./Dec. 1989).
Mazza et al., II Farmaco Ed. Sc., 29, pp. 58-72 (1974).
Chem. Abs. 89:60506a (1978).
Chem. Abs. 89:6837 (1978).
Chem. Abs. 69:97551v (1968).
Burkey et al., J. Org. Chem. 48, 3704 (1983).
Vernin et al., J. Heterocycl. Chem. 46, 97 (1979).
Vernin et al., J. Chem. Research (S) 151 (1980).
Vernin et al., J. Chem. Research (S) 26 (1979).
Vernin et al., J. Chem. Research (S) 921 (1978).
Buxton et al., J.C.S. Chem. Comm. 545 (1973).
Elks et al., J. Chem. Soc. 441 (1943).
Rondestvedt et al., J. Amer. Chem. Soc. 77, 1769 (1955).
Smith, Jr. et al. J. Org. Chem. 53, 1467 (1988).
Takeishi et al., Polymer Letters 8, 829 (1970).
Patent Abstract of Japan JP-A-63 033423 (Mitsubishi Rayon Co. Ltd.), Feb. 1988.

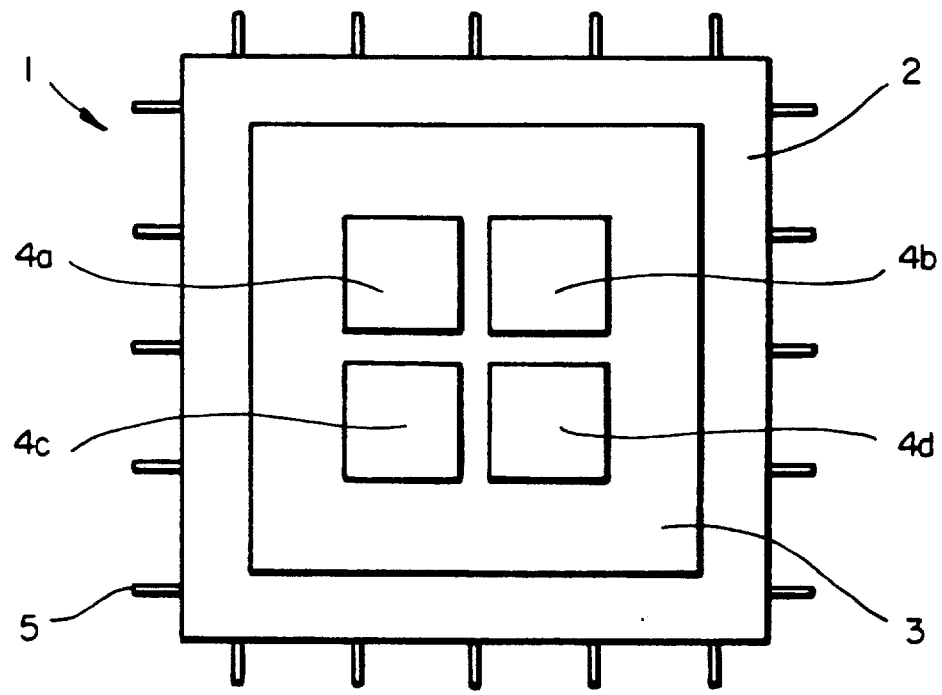
FIG_1a
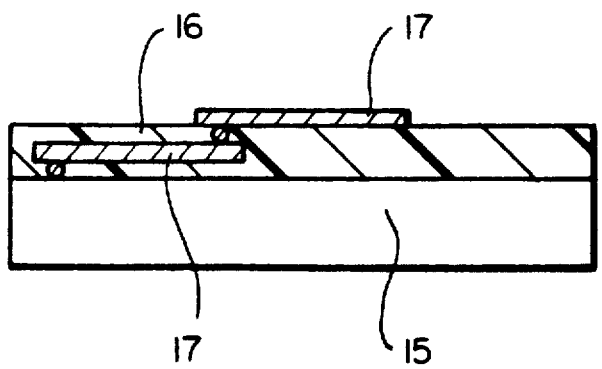
FIG_2

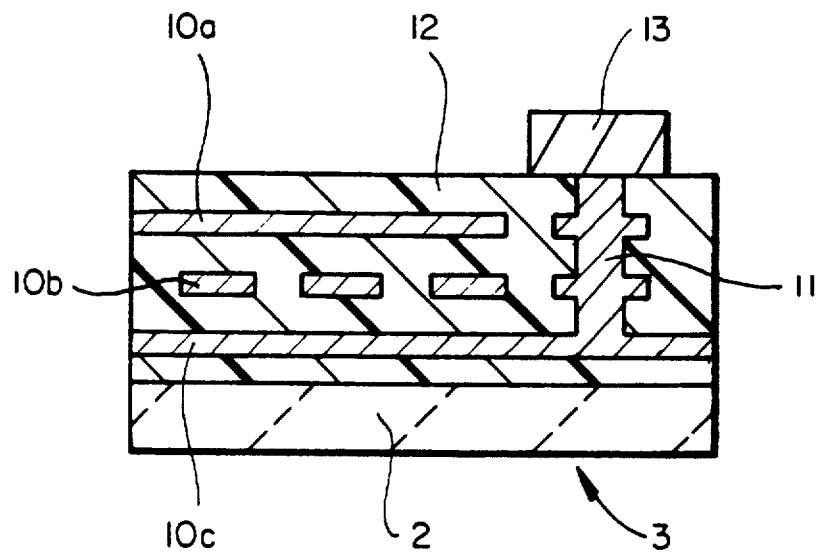
FIG_1b
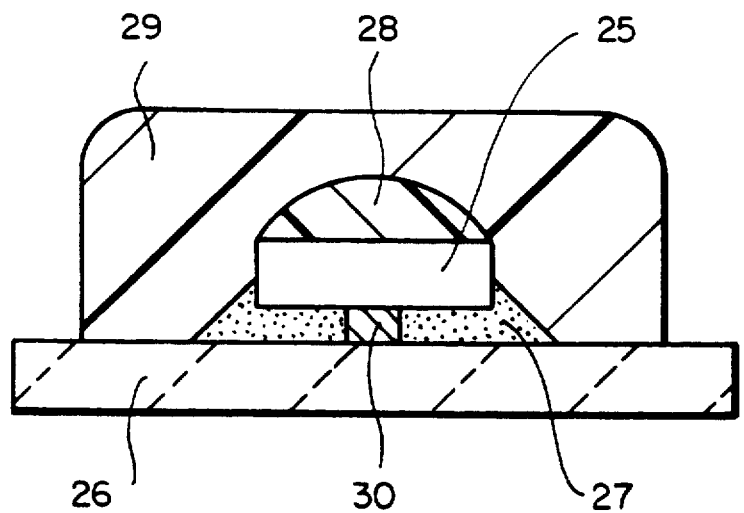
FIG_3

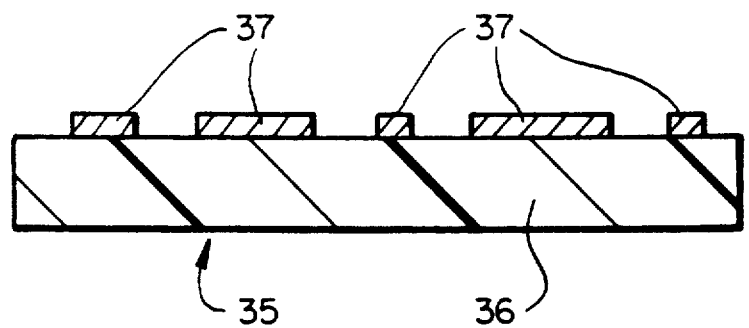
FIG_3a
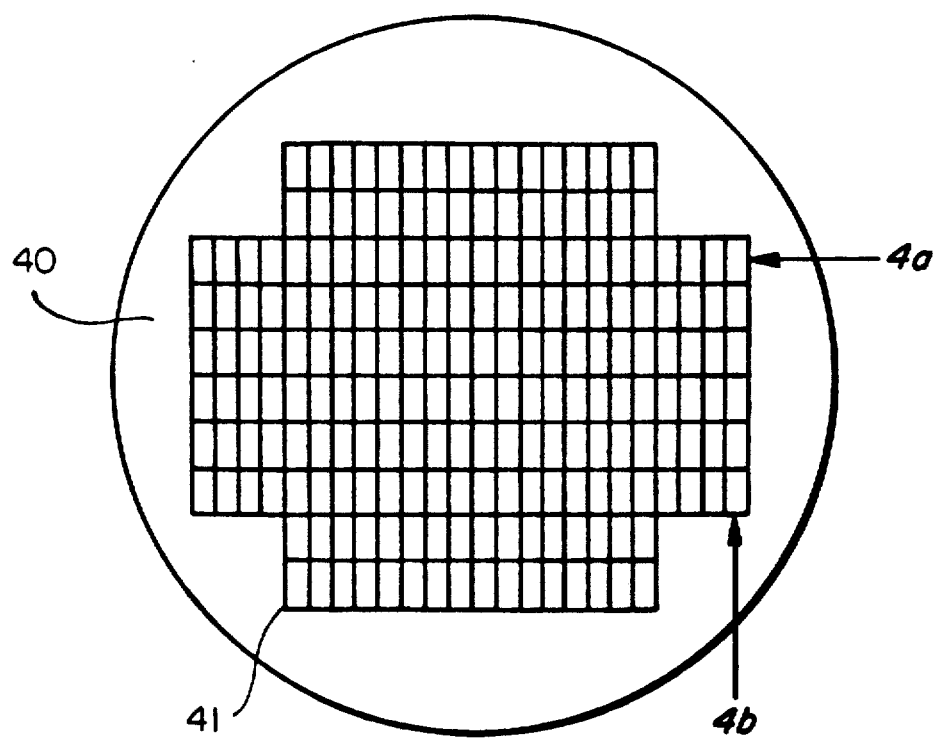
FIG_4

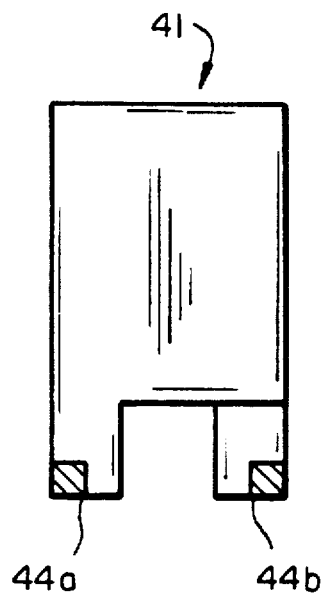
FIG_4a
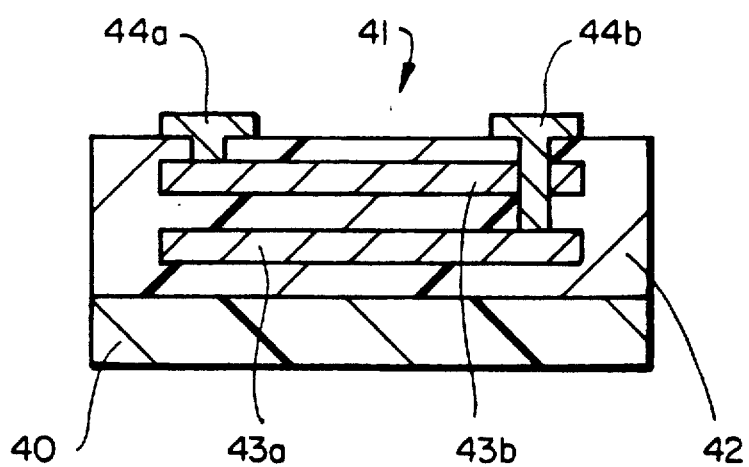
FIG_4b

CROSSLINKABLE FLUORINATED POLYARYLENE ETHER COMPOSITION

CROSS-REFERENCE TO RELATED APPLICATIONS

This application is a continuation-in-part of application Ser. No. 07/510,386, filed Apr. 17, 1990; abandoned application Ser. No. 07/510,353, filed Apr. 17, 1990; abandoned and application Ser. No. 07/447,750, filed Dec. 8, 1989; abandoned the disclosure of each of which is incorporated herein by reference.

BACKGROUND OF THE INVENTION

This invention relates to novel crosslinkable and crosslinked fluorinated compositions which are useful as dielectric materials in electronic articles.

Polymer films and coatings are often used in the electronic industry as insulating materials and passivation layers, especially in integrated circuit devices such as multichip modules. Polymers having a low dielectric constant $\epsilon$ are preferred, because components insulated with them can be designed with higher circuit densities and can operate at higher speeds and with less signal broadening. The effect of $\epsilon$ on the performance of multilayer integrated circuit articles is discussed in "Microelectronics Packaging Handbook," Tummala et al. (eds.), pp. 687-692 (van Nostrand Reinhold); Watari et al., U.S. Pat. No. 4,744,007 (1988); and Budde et al., U.S. Pat. No. 4,732,843 (1988).

Polyimide is an insulator of choice for many electronic applications, because of its superior mechanical and thermal properties and its fabricability into thin films and coatings. However, polyimide has a relatively high $\epsilon$, a limitation accentuated by polyimide's tendency to absorb water (up to 3-4%) in humid environments. Water absorption causes $\epsilon$ to rise, compromising performance. One commercially available polyimide has an $\epsilon$ of about 3.2 at 0% relative humidity (% RH), which rises to about 3.8 at 60% RH. As noted by Denton et al. in *J. Electronic Mater*, 14(2), 119 (1985), polyimide moisture absorption can also adversely affect performance through increased insulator conductivity, loss of adhesion, or corrosion. Further, some polyimides are susceptible to hydrolysis and/or attack by solvents (often manifested by crazing or cracking upon exposure to a solvent).

It has been proposed, in Mercer, U.S. Pat. No. 4,835,197 (1989), to improve the solvent resistance of polyimide by curing with an acetylene, maleimide, or vinyl terminated curing agent. However, a polyimide so cured would still have the relatively high dielectric constant of polyimides and their tendency to absorb moisture.

Mercer, in copending commonly assigned application Ser. No. 07/447,771, filed Dec. 8, 1989, proposes using fluorinated polymers having a binaphthyl moiety as dielectric materials.

Polyquinoxalines, polyquinozalones, polybenzoxazoles, and copolymers thereof with polyimides have also been proposed as polymers for microelectronic applications by Labadie et al., in SAMPE J. vol. 25, pp. 18-22 (November December 1989).

Kellman et al., ACS Symp. Ser. 326, Phase Transfer Catalysis, p. 128 (1987) discloses the preparation of polyethers from diphenols and hexafluorobenzene and decafluorobiphenyl, although no particular utility is disclosed for the polymers so prepared. Similar disclosures are made in Kellman et al., Polym. Prepr. 22(2), 383 (1981) and Gerbi et al., J. Polym. Sci. Polym. Letters Ed. 23, 551 (1985).

This invention provides a crosslinkable fluorinated composition which is especially suitable, when crosslinked, as a dielectric material in electronic articles. The polymers of this invention have low dielectric constants which are little affected by increases in the ambient humidity, can be made solvent resistant, and exhibit excellent adhesion to itself and other adherends.

SUMMARY OF THE INVENTION

This invention provides a crosslinkable composition comprising:

(i) a fluorinated poly(arylene ether) comprising a repeat unit of the structure

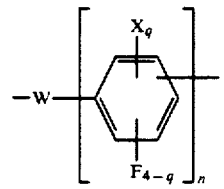

wherein —W— is

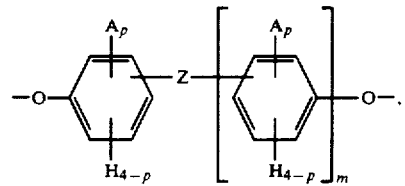

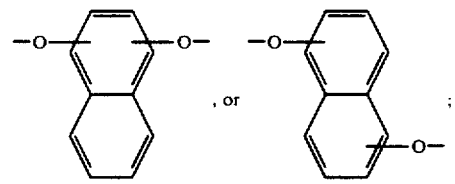

wherein each —A is independently —F, —Cl, —Br, —CF$_3$, —CH$_3$, —CH$_2$CH=CH$_2$, or —C$_6$H$_5$; p is 0, 1, or 2; —Z— is a direct bond, —C(CH$_3$)$_2$—, —C(CF$_3$)$_2$—, —O—, —S—, —SO$_2$—, —CO—, —P(C$_6$H$_5$)—, —C(CH$_3$)(C$_6$H$_5$), —C(C$_6$H$_5$)$_2$—, —(CF$_2$)$_{1-6}$—, or

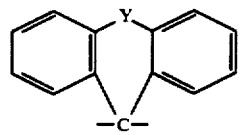

wherein —Y— is —O— or a direct bond; and m is 0, 1, or 2; each —X is independently —H, —Cl, —Br, —CF$_3$, —CH$_3$, —CH$_2$CH=CH$_2$, or —C$_6$H$_5$; q is 0, 1, or 2; and n is 1 or 2; and (ii) a bistriazene compound of the formula

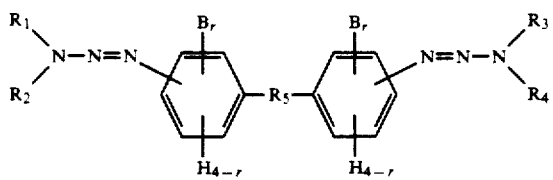

wherein —$R_1$, —$R_2$, —$R_3$, and —$R_4$ are independently —H, —$C_6H_5$, —$C_6H_4Y'$, or $C_1$-$C_4$ alkyl; —$R_5$— is —O—, —$SO_2$—,

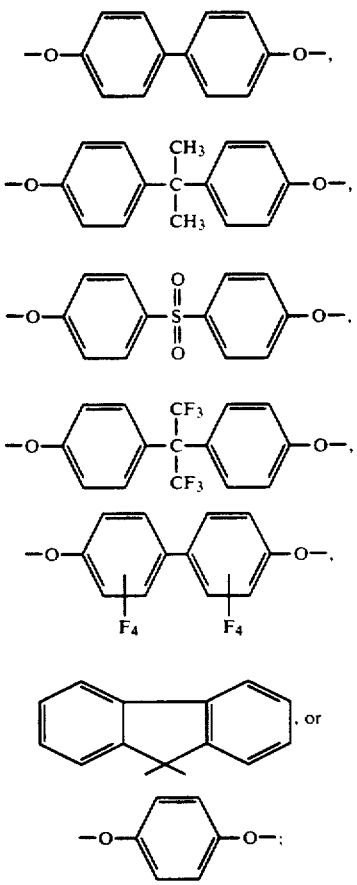

—B is —F, —Cl, —Br, —$CH_3$, or —$CF_3$; r is 0, 1, 2, 3, or 4; and —Y' is halogen, —$NO_2$, —$C_6H_5$, or $C_1$-$C_4$ alkyl; bistriazene compound (ii) being present in an amount effective to crosslink fluorinated poly(arylene ether) (i).

Preferably, —W— is

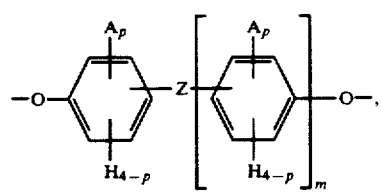

corresponding to a fluorinated poly(arylene ether) comprising the repeat unit

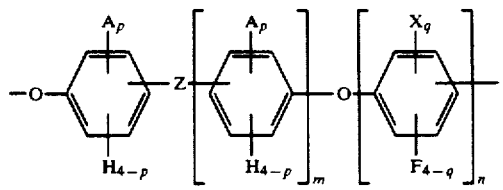

wherein —A, p, —Z—, m, —X, q, and n are as previously defined. Further, the group —Z— is preferably para-bonded to each ether oxygen in the benzene rings.

This invention also provides a method of crosslinking a fluorinated poly(arylene ether) comprising a repeat unit as aforesaid, by forming an intimate mixture of the fluorinated poly(arylene ether) and a bistriazene compound of aforesaid structure, forming a shaped body from the intimate mixture, and heating the shaped article to a temperature above the decomposition temperature of the bistriazene compound, thereby effecting the crosslinking of the fluorinated poly(arylene ether).

This crosslinkable fluorinated poly(arylene ethers) can be used, in its crosslinked form, as dielectric materials in multilayer interconnects in integrated circuit chips and multichip modules, as protective materials for chips, and as a substrate material for circuit boards.

BRIEF DESCRIPTION OF THE DRAWING(S)

FIG. 1a depicts a multichip module having a multilayer interconnect in which the interlayer dielectric is a crosslinked composition of this invention. FIG. 1b shows in cross-section the multilayer interconnect.

FIG. 2 shows in cross section an integrated circuit chip having thereon a multilayer interconnect in which the interlayer dielectric is a crosslinked fluorinated poly(arylene ether) of this invention.

FIG. 3 shows in cross section an integrated circuit chip protected by a coating of a crosslinked fluorinated poly(arylene ether) of this invention.

FIG. 3a shows in cross-section a circuit board in which the substrated is made from a fluorinated poly(arylene ether).

FIGS. 4 and 4a-b show a substrate carrying a plurality of multilayer devices having as an interlayer dielectric a crosslinked fluorinated poly(arylene ether) of this invention.

DESCRIPTION OF THE PREFERRED EMBODIMENTS

The fluorinated poly(arylene ethers) (i) of this invention can be made by the condensation polymerization of a diphenol (I) with a fluorinated monomer (II):

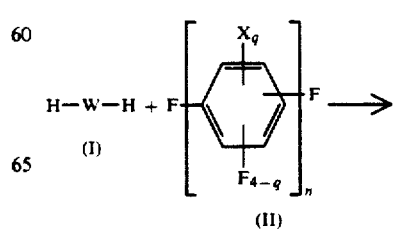

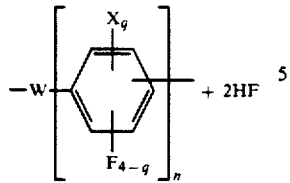

In the equation above, —W—, —X, q, and n have the same meaning as defined earlier. Suitable diphenols (I) include 4,4'-(hexafluoroisopropylidene)diphenol, 4,4'-isopropylidene-di(2,6-dimethylphenol), 4,4'-(1-phenylethylidene) bisphenol, 4,4'-isopropylidenediphenol, 9,9'-bis(4-hydroxyphenyl)fluorene, 1,5-dihydroxynapthalene, 2,7-dihydroxynapthalene, resorcinol, and 4,6-dichlororesorcinol, corresponding to fluorinated poly(arylene ether) repeat units in which —W— is:

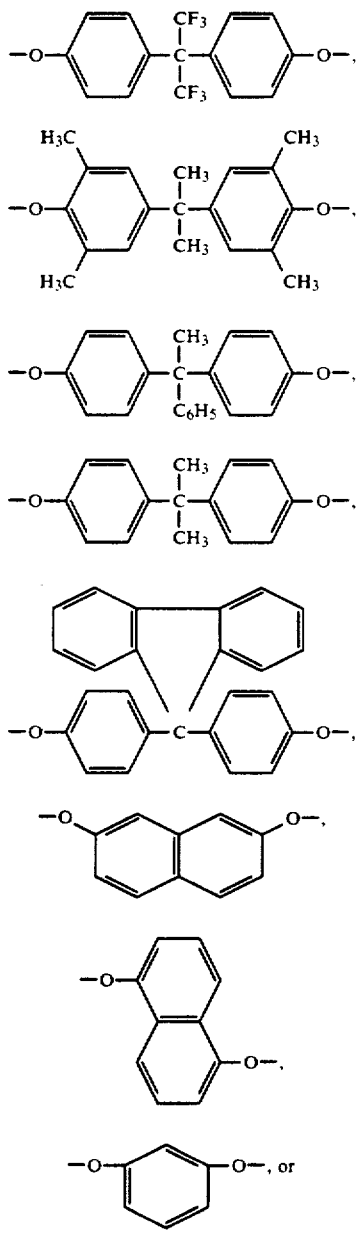

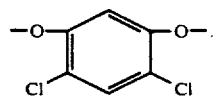

Preferred diphenols (I) include 4,4'-(hexafluoroisopropylidene)diphenol, 9,9'-bis(4-hydroxyphenyl)fluorene, and 1,5-dihydroxynaphthalene.

Suitable fluorinated monomers (II) include hexafluorobenzene, decafluorobiphenyl, pentafluorobenzene, octafluorotoluene, 1,4-dibromotetrafluorobenzene, chloropentafluorobenzene, allylpentafluorobenzene, and 2,2',3,3',5,5',6,6'-octafluorobiphenyl, corresponding to fluorinated poly(arylene ether) repeat units in which

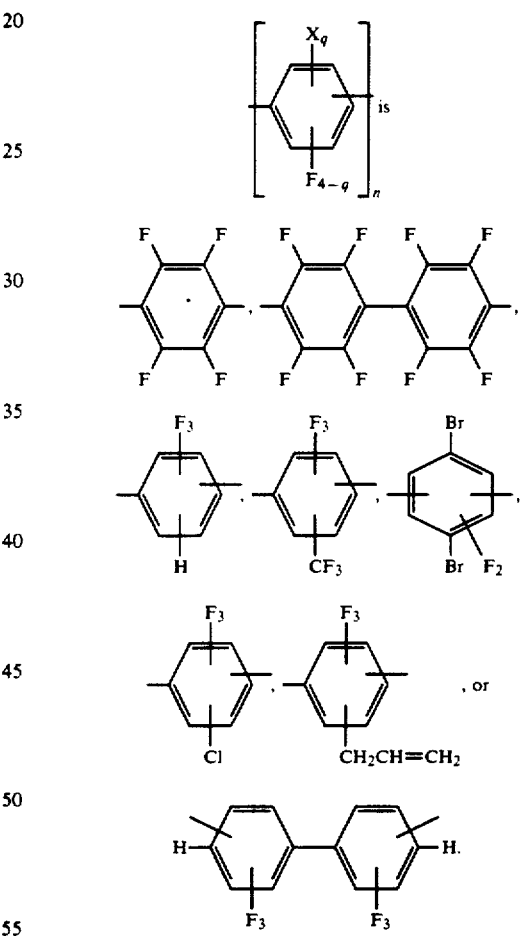

Preferred fluorinated monomers includes hexafluorobenzene and decafluorobiphenyl.

Contrary to what has been taught in the art, it has been discovered that complete fluorine substitution of the aromatic ring in monomers (II) is not necessary for effective polymerization, monomers such as pentafluorobenzene, octafluorotoluene, 1,4-dibromotetrafluorobenzene, and chloropentafluorobenzene being suitable.

Monomers (I) and (II) are used in substantially stoichiometric amounts if high molecular weight polymer is desired. Alternatively, if lower molecular weight material is desired, for example to facilitate the preparation of solutions for spin or other solvent coating operations, a slight stoichiometric excess of either monomer can be used to control the molecular weight.

A base such as an alkali metal carbonate, bicarbonate, or hydroxide is added to the polymerization mixture to convert the phenoxy groups to the corresponding phenoxides. Sodium and potassium carbonate are preferred. A polar aprotic solvent, such as N,N-dimethylacetamide, N,N-dimethylformamide, or 1-methyl-2-pyrrolidinone is used. The use of such solvents is advantageous compared to other solvents such as nitrobenzene, which are more toxic and which are not soluble in water, thereby requiring work-up of the polymerization mixture in an organic solvent as opposed to water. The reaction is carried out at an elevated temperature, although such temperature should not be excessively high. A temperature between about 50° C. and about 125° C. is generally suitable, with a temperature between about 60° and about 90° C. being especially preferred. Reaction times are typically between about 10 and about 72 hours.

The following repeat units are preferred:

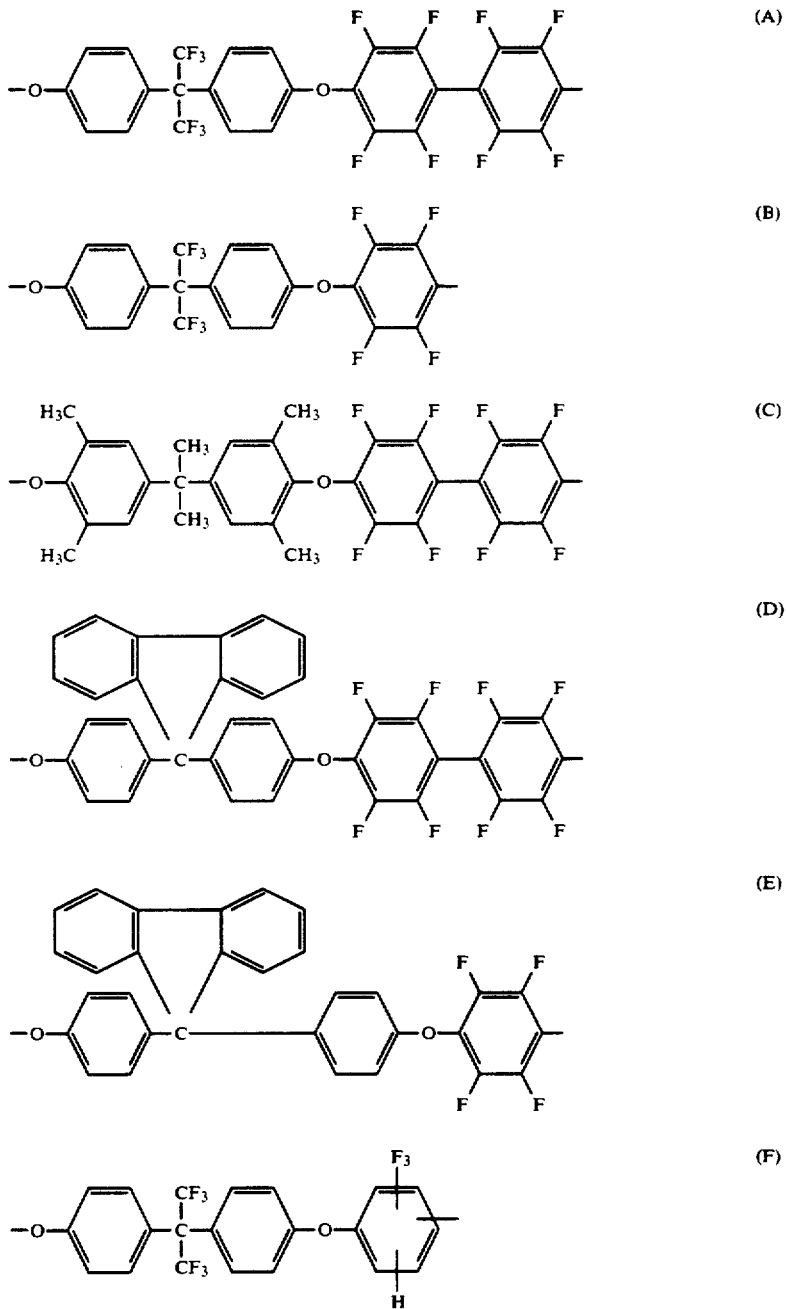

-continued
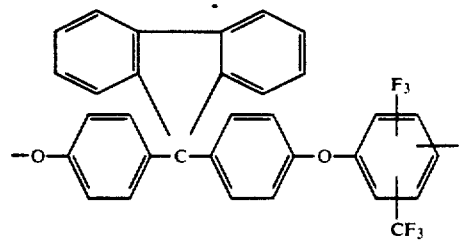 (G)
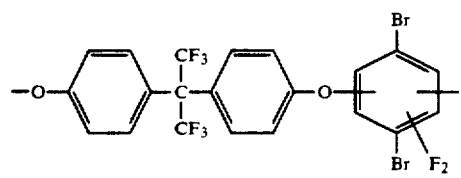 (H)
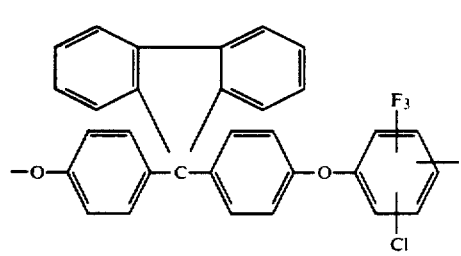 (I)
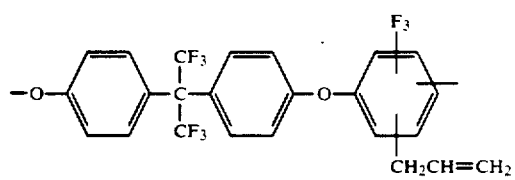 (J)
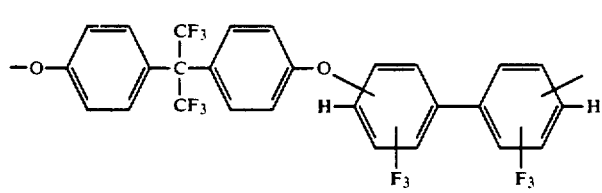 (K)
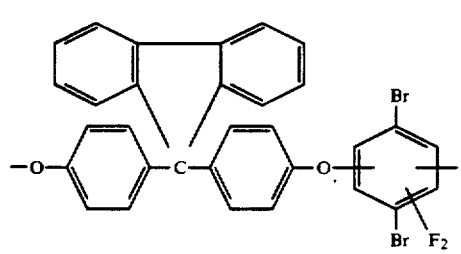 (L)
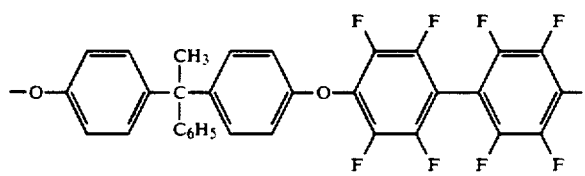 (M)

-continued

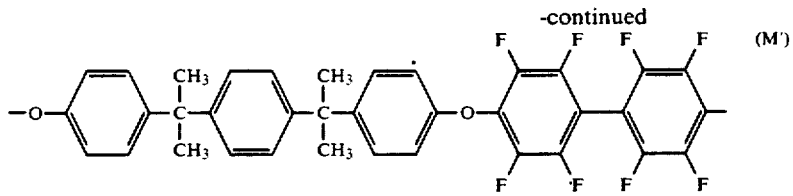
(M')

The polymers can be homopolymers, consisting essentially of a single repeat unit such as one of the aforementioned ones. Or, they can be copolymers comprising a repeat unit of this invention in combination with another repeat unit of this invention or with a different type of repeat unit. Fluorinated poly(arylene ether) copolymers can be made for example by using two different diphenols (I) as comonomers, or two different fluorinated monomers (II) as comonomers. A preferred copolymer comprises repeat units (A) and (N):

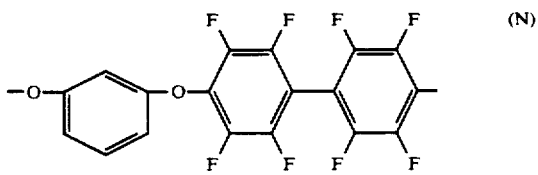
(N)

Another preferred copolymer comprises the repeat units (A) and (D). Yet another preferred copolymer comprises repeat units (A) and (O)

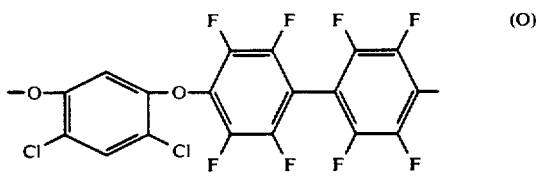
(O)

Still other preferred copolymers comprise repeat unit (A) and either repeat unit (P) or (Q) or repeat unit (D) with repeat unit (Q):

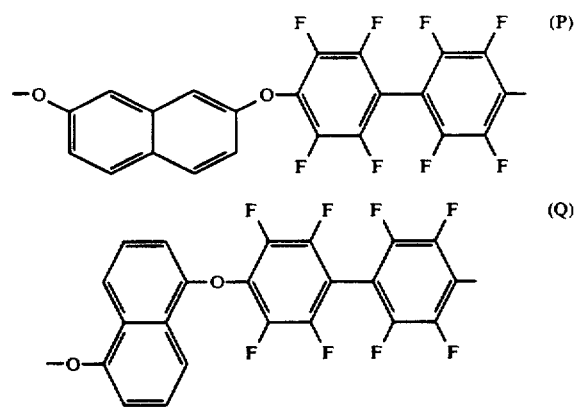
(P)

(Q)

In a copolymer where a repeat unit of this invention is combined with a repeat unit of another type of polymer, it is preferred that at least 60 mole %, more preferably at least 80 mole %, of the repeat units are a fluorinated aromatic ether repeat unit according to this invention. A copolymer can be alternating, random, or block.

FIG. 1a shows a multichip module 1 employing crosslinked fluorinated compositions of this invention. Substrate 2, typically made of silicon, glass, or ceramic, supports high density multilayer interconnect 3 in which the dielectric material providing insulation between the various layers is a crosslinked fluorinated poly(arylene ether). On interconnect 3 are mounted semiconductor chips 4a-d, which are connected to each other by electrical conductors in interconnect 3. Substrate 1 may also contain electrical conductors, for example for power and ground. Lead frames 5 (only one labeled for simplicity) provide connections to external circuitry.

FIG. 1b shows a partial cross-section of multilayer interconnect 3 supported on substrate 2. Layers of electrical connections 10a-c are separated from each other by a crosslinked fluorinated poly(arylene ether) dielectric 12. Via 11 provides connections between the various layers as necessary. Interconnect 3 is connected to an integrated circuit chip (not shown) by bond pad 13. Via 11 is shown here in the stacked pillar design, although other designs conventional in the art, such as the stair-stepped or nested via designs, can be used. Other multichip module designs in which the fluorinated poly(arylene ethers) of this invention can be used as interlayer dielectrics is disclosed in Balde, "Overview of Multichip Technology", Electronic Materials Handbook, vol. 1, Packaging ASM International, p. 297-312 (1989), the disclosure of which is incorporated herein by reference.

The crosslinked fluorinated poly(arylene ethers) can also be used as interlayer dielectrics in an interconnect associated with a single integrated circuit chip. FIG. 2 shows this embodiment in cross-section. Integrated circuit chip 15 has on a surface thereof plural layers 16 of crosslinked poly(arylene ether) dielectric and multiple layers of metal conductors 17.

The crosslinked fluorinated compostions of this invention can further be used as protective coatings on integrated circuit chips, for protection against alpha particles. Semiconductor devices are susceptible to soft errors when alpha particles emitted from radioactive trace contaminants in the packaging or other nearby materials strike the active surface. FIG. 3 shows schematically an integrated circuit having a protective coating of crosslinked fluorinated poly(arylene ether). Integrated circuit chip 25 is mounted on substrate 26 and held in place with the assistance of adhesive 27. A coating of crosslinked fluorinated poly(arylene ether) 28 provides an alpha particle protection layer for the active surface of chip 25. Optionally, additional protection is provided by encapsulant 29, made of for example epoxy or silicone. Conductor 30 provides connections between chip 25 and conductors (not shown) on substrate 26 and thence to external circuitry.

The fluorinated poly(arylene ethers) can also be used as a substrate (dielectric material) in circuit boards (also referred to as printed wiring boards or PWB's). FIG. 3a shows in cross-section a circuit board 35 made of a substrate 36 having on a surface thereof a pattern of conductors 37. Substrate 36 is made of a fluorinated poly(arylene ether) of this invention. Substrate 36 may be reinforced with woven nonconducting fibers, such as glass cloth. Although in FIG. 3a the circuit board is shown as single sided, those skilled in the art will appreciate that other constructions, such as double sided or multilayer, can also be made with a fluorinated poly(arylene ether) substrate.

Films or coatings of fluorinated poly(arylene ethers) can be formed by solution techniques such as spraying, spin coating, or casting, with spin coating being preferred. Preferred solvents are 2-ethoxyethyl ether, cyclohexanone, N,N-dimethylformamide, N,N-dimethylacetamide, methyl isobutyl ketone, 2-methoxyethyl ether, 5-methyl-2-hexanone, γ-butyrolactone, and mixtures thereof. Typically the coating thickness is between about 3 to about 15μ.

Additives can be used to enhance or impart particular target properties, as is conventionally known in the polymer art, including stabilizers, flame retardants, pigments, plasticizers, surfactants, and the like. Compatible or non-compatible polymers can be blended in to give a desired property.

Polymers for microelectronic applications desirably contain low levels (generally less than 20 ppm) of ionic impurities. If a polymer is made by a synthetic route which requires the use of a transition metal reagent or catalyst, the effective removal of transition metal residues may be a difficult task. An advantage of the instant polymers is that they can be made by a route which does not involve transition metal species, and the potassium (or sodium) carbonate reagent and potassium (or sodium) fluoride by-product can be easily removed.

In the bistriazene compounds (ii), preferably each of —R₁, —R₂, —R₃ and —R₄ is methyl and r is 0. Also preferably, —R₅— is.

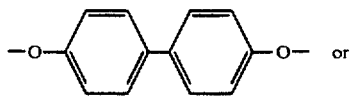

-continued

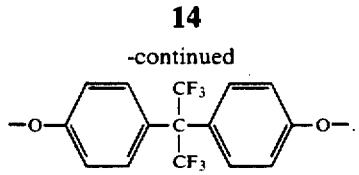

It is also preferred that the bistriazene groups be located para- to the —R₅— group.

Particularly preferred bistriazene crosslinking agents (ii) are

and

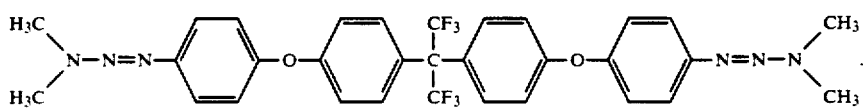

Bistriazene crosslinking agents (ii) can be prepared by treating a solution (in a solvent such as tetrahydrofuran or methanol) of a diamine of the formula

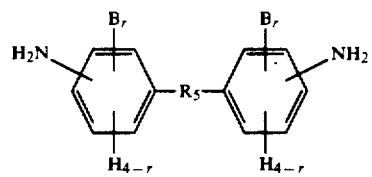

wherein —R₅—, —B, and r are as defined hereinabove, with hydrochloric acid and sodium nitrite, followed by a diamine such as dimethylamine.

The bistriazene crosslinking agent (ii) is used in an amount effective to crosslink the fluorinated polymer (i), preferably between about 10 and about 40, more preferably between about 15 and about 30 weight %, based on the combined weights of the polymer and bistriazene compound. The fluorinated poly(arylene ether) and the bistriazene compound are intimately mixed, preferably by solution mixing. A film of the mixture is formed, for example by spin coating, and the solvent is removed.[1] Crosslinking is effected by heating to a temperature above the decomposition temperature of the bistriazene compound, typically between 300° and 400° C., optionally with a stepped or stagewise heating profile, typically for between about 15 and 90 minutes total time.

[1] Are there any other ways of making the mixture and shaping it?

It is believed that, when heated up to or above a threshold temperature, the triazene groups decompose to form phenyl radicals. These then insert into aromatic groups in the fluorinated poly(arylene ether) to form aryl-aryl crosslinkages, as illustrated by the following equations:

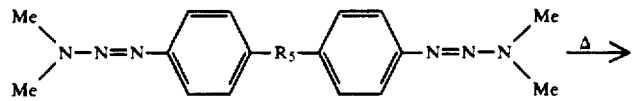

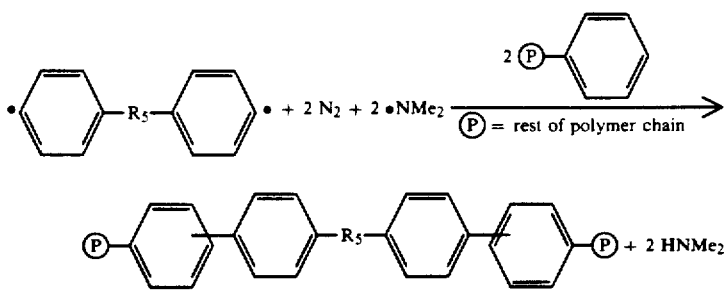

As a matter of convenience, in the equations the triazene groups have been depicted as decomposing simultaneously to give a diradical. It is possible, if not likely, that the decomposition is not entirely simultaneous, so that monoradicals are also formed, which, however, would react in a similar fashion, albeit sequentially. A noteworthy aspect is that the crosslinks are via aryl-aryl bonds. Compared to their aliphatic counterparts, these are much less vulnerable to thermooxidative or other chemical attack and hence stabler.

The crosslinked fluorinated poly(arylene ethers) show good high temperature stability.

The crosslinked compositions are also useful as adhesives and matrix resins for composite applications. Further, they are also useful as solvent resistant, crosslinked films for a variety of applications, such as wires having a wrapped insulation, especially after crosslinking.

The practice of our invention can be further understood by reference to the following examples, which are provided by means of illustration, not limitation.

EXAMPLE 1

This example describes the preparation of a polymer having repeat unit (A): To a 500 mL round bottom flask was added 15.01 g (0.0447 mole) of 4,4'-(hexafluoroisopropylidene)diphenol ("6F-diphenol"), 15.29 g (0.0458 mole) of decafluorobiphenyl, 240 g of dimethylacetamide ("DMAc"), and 16.85 g (0.125 mole) of potassium carbonate. The mixture was heated with stirring under nitrogen at about 80° C. for 23 hours. The mixture was filtered hot to remove the unreacted potassium carbonate and potassium fluoride by-product. About 75 mL of DMAc was removed by rotary evaporation. The solution was cooled to room temperature and poured into water to precipitate the polymer. The polymer was filtered, washed three times with water, suspended in 200 mL of ethanol for 2 hours, filtered, and dried at 100° C. for 2 hours to yield a white powder. A solution of 2 grams of polymer in 8 grams of a 50/50 mixture of 2-ethoxy ethyl ether and cyclohexanone was spin coated onto a ceramic substrate and dried 15 minutes at 100° C., 20 minutes at 180° C., and 45 minutes at 400° C. The resulting polymer film was tough and flexible, insoluble in 2-ethoxy ethyl ether, and had a $T_g$ of 189° C. by DSC (192° C. by TMA).

EXAMPLE 2

This example describes the preparation of a polymer having repeat unit (B): To a 100 mL round bottom flask was added 2.20 g (0.0118 mole) of hexafluorobenzene, 3.90 g (0.0116 mole) of 6F-diphenol, 4.0 g (0.030 mole) of potassium carbonate, and 50 g of DMAc. The mixture was heated with stirring under nitrogen at about 70° C. for 48 hours. The mixture was then worked up as described in Example 1 to yield a white powder. A film of the polymer obtained was tough and flexible, insoluble in 2-ethoxy ethyl ether, and had a $T_g$ of about 185° C. by DSC.

EXAMPLE 3

This example describes the preparation of a polymer having repeat unit (C): The reaction of Example 1 was repeated except that 12.7 g of 4,4-isopropylidene bis(2,6-dimethylphenol) ("tetramethyl Bisphenol A") was used in place of the 6F-diphenol and the reaction was heated to 80° C. for 72 hours. 22.3 g of polymer was obtained. A film of the polymer had a moisture absorption of 0.15% after immersion in 50° C. water for 16 hours.

EXAMPLE 4

This example describes the preparation of the copolymer having repeat units (A) and (N): The reaction of Example 1 was repeated except that a mixture of 7.51 g of 6F-diphenol and 2.458 g of resorcinol was used in place of the 6F-diphenol. 19.8 g of polymer was obtained. A film of the polymer had a moisture absorption of 0.10% after immersion in 50° C. water for 16 hours.

EXAMPLE 5

The polymer having the repeat unit (D) was prepared as follows: To a 250 mL round bottom flask was added 10.15 g (0.029 mole) of 9,9-bis(4-hydroxyphenyl)fluorene, 9.97 g (0.0298 mole) of decafluorobiphenyl, 115 g of DMAc, and 10.0 g (0.074 mole) of potassium carbonate. The mixture was heated with stirring under nitrogen at 75° C. for 16 hours. The mixture was cooled to room temperature, poured into rapidly stirring water to precipitate the polymer, filtered, washed twice with water, filtered and dried. A white fluffy powder was obtained. Two grams of the white polymer powder were dissolved in 8 grams of a 50/50 mixture of cyclohexanone and 2-ethoxy ethyl ether. About 1.5 mL of the polymer solution was spin coated onto a glass substrate and dried 10 min at 100° C., 15 min at 200° C., and 30 min at 400° C. The resulting polymer film was released from the glass substrate by immersion in water to yield a tough, flexible, transparent film. The film had a dielectric constant of 2.62 at 0% RH and a dielectric constant of 2.68 at 58% RH. The polymer had a $T_g$ of about 258° C. by DSC.

EXAMPLE 6

This example describes the preparation of the polymer having the repeat unit (E): The procedure of Example 5 was repeated, except that 5.54 g (0.0298 mole) of hexafluorobenzene was used in place of the decafluorobiphenyl and the reaction was allowed to run for 42 hours. The resulting polymer film had a dielectric constant of 2.65 at 0% RH and of 2.73 at 58% RH.

EXAMPLE 7

This example describes the preparation of the copolymer having repeat units (A) and (D): To a 250 mL round bottom flask was added 5.07 g (0.0145 mole) of 9,9-bis(4-hydroxyphenyl)fluorene, 4.87 g (0.0145 mole) of 6F-diphenol, 9.97 g (0.0298 mole) of decafluorobiphenyl, 115 g of DMAc, and 10.0 g (0.074 mole) of potassium carbonate. The mixture was heated with stirring under nitrogen at 75° C. for 16 hours. The mixture was cooled to room temperature, poured into rapidly stirring water to precipitate the polymer, filtered, washed twice in 300 mL of water, filtered and dried. A white fluffy powder was obtained. Two grams of the white polymer powder were dissolved in 8 grams of a 50/50 mixture of cyclohexanone and 2-ethoxy ethyl ether. About 1.5 mL of the polymer solution was spin coated onto a glass substrate and dried 10 min. at 100° C., 15 min. at 200° C., and 30 min. at 400° C. The resulting polymer film was released from the glass substrate by immersion in water to yield a tough, flexible, transparent film. The film had a dielectric constant of 2.60 at 0% RH and 2.66 at 58% RH.

EXAMPLE 8

This Example describes the preparation of a polymer having repeat unit (F). To a 100 mL round bottom flask was added 3.50 g (0.0208 mol) of pentafluorobenzene, 7.00 g (0.0208 mol) of 6F-diphenol, 4.2 g of potassium carbonate, and 50 g of DMAc. The mixture was heated to 80° C. for 24 hours under nitrogen with stirring, then heated to 120° C. for an additional 36 hours. The mixture was allowed to cool to room temperature and poured into water to precipitate the polymer as a lightly colored powder. The polymer was washed three times with water and dried at room temperature for 18 hours and at 100° C. for 4 hours. One gram of polymer was dissolved in 4 grams of a 1:1:1 mixture of DMAc, 2-ethoxy ethyl ether, and cyclohexanone. The mixture was spin coated on to a glass substrate and cured 15 min at 100° C., 15 min at 200° C., and 15 min at 400° C. to yield an amber film. The polymer had a moisture absorption of 0.15%. Based on model studies with similar fluorinated benzenes, discussed in more detail below, and the expected mechanism for the polymerization reaction, it is believed that in the pentafluorobenzene two fluorines are displaced, with the hydrogen being retained. Polymer (F) had a Tg of 120° C. by DSC.

EXAMPLE 9

This example describes the preparation of a polymer having repeat unit (G). The procedure in Example 8 was repeated except that 4.99 g (0.0211 mol) of octafluorotoluene was used in place of pentafluorobenzene and 7.38 g (0.0211 mol) of 9,9-bis(4-hydroxyphenyl)fluorene was used instead of the 6F-diphenol. The reaction was run at 80° C. for 24 hours and then at 120° C. for an additional 24 hours. A white powder was obtained. Again, it is believed that two ring fluorines are displaced, with the trifluoromethyl group remaining intact. The polymer had a $T_g$ of 260° C. by DSC.

EXAMPLE 10

This Example describes the preparation of a polymer having repeat unit (H). The procedure in Example 9 was repeated except that 6.40 g (0.0208 mol) of 1,4-dibromotetrafluorobenzene was used in place of octafluorotoluene. A white powder was obtained. One gram of the powder was dissolved in 4 grams of DMAc and spin coated on to glass substrate and cured as described in Example 8 to yield an amber film. The polymer had a dielectric constant of 2.6 and a moisture absorption of 0.15%. Its $T_g$ was 199° C. as measured by DSC.

GC-MS analysis of the products from the model reaction between phenol (2 equivalents) and 1,4-dibromotetrafluorobenzene showed that two fluorines were displaced, with the two bromines being retained and a mixture of isomeric products being obtained. Thus, it is believed that in polymer (H), the two bromines were also retained.

EXAMPLE 11

This Example describes the preparation of a polymer with repeat unit (I). To a 100 mL round bottom flask was added 5.05 g (0.0249 mol) of chloropentafluorobenzene, 9.10 g (0.0260 mol) of 9,9-bis(4-hydroxyphenyl)fluorene, 65 g of DMAc, and 11.5 g of potassium carbonate. The mixture was heated to 100° C. for 27 hours under nitrogen with stirring. The mixture was allowed to cool to room temperature and poured into water with stirring to precipitate the polymer. The polymer was washed with three times with water and dried at room temperature for 18 hours and at 100° C. for 5 hours to yield a white powder. Two grams of the polymer were dissolved in 8 mL of a 1:1 mixture of 2-ethoxy ethyl ether and cyclohexanone, spin coated onto a glass substrate, and dried as described in Example 8. An amber film was obtained. The polymer had a moisture absorption of 0.1%.

GC-MS analysis of the product from the model reaction between phenol (2 equivalents) and chloropentafluorobenzene showed that two fluorines were displaced, with the chlorine being retained and a mixture of isomeric products being obtained. Thus, it is believed that, in polymer (I), the chlorine was also retained.

EXAMPLE 12

This Example describes the preparation of a polymer with repeat unit (J). To a 100 mL round bottom flask was added 4.20 g (0.0202 mol) of allylpentafluorobenzene, 6.85 g (0.0204 mol) of 6F-diphenol, 45 mL of DMAc, and 8.0 g of potassium carbonate. The mixture was heated to 110° C. under nitrogen with stirring for 72 hours. The mixture was allowed to cool to room temperature and was poured into water to precipitate the polymer. The polymer was washed with 100 mL of deionized water and 100 mL of denatured ethanol and dried in air for 3 days to yield a light yellow powder. Three grams of the powder and 0.15 g of t-butyl peroxybenzoate were dissolved in 8.5 mL of DMAc and spin coated onto a glass substrate and dried 10 min at 110° C. and 20 min at 200° C. to yield an amber film that was insoluble in DMAc.

GC-MS analysis of the product from the reaction between phenol (2 equivalents) and allylpentafluorobenzene showed that two fluorines were displaced, with the allyl group being retained and a mixture of isomeric products being obtained. Thus, it is believed that, in the polymer described above, the allyl group was also retained.

EXAMPLE 13

This example describes the preparation of a polymer with repeat unit (K): To a 100 ml round bottom flask was added 1.25 g (0.0042 mol) 2,2',3,3',-5,5',6,6'-octafluorobiphenyl ("OFB"), 1.41 g (0.0042 mol) of 6F-diphenol, 19 g of DMAc, and 2 g of potassium carbonate. The mixture was heated to 120° C. for 72 hours under nitrogen with stirring. The mixture was allowed to cool to room temperature and poured into water to precipitate the polymer. The polymer was collected by filtration, washed with 75 mL of a 50/50 mixture of ethanol and water, and dried over night at room temperature, followed by 1 hour at 100° C. to yield a white powder. The polymer had a $T_g$ of 147° C. by DSC.

GC/MS analysis of the product from the reaction between 4-methoxyphenyl (2 equivalents) and OFB showed that two fluorines were displaced, with retention of the two hydrogens, and a mixture of isomeric products being obtained. Thus, it is believed that, in the polymer described above, the two hydrogens were also retained.

EXAMPLE 14

This example describes the preparation of a polymer with repeat unit (L). The procedure of Example 12 was repeated with the exception that 6.22 g (0.0202 mol) of 1,4-dibromotetrafluorobenzene, 7.07 g (0.0202 mol) of 9,9-bis(4-hydroxyphenyl)fluorene, 10 g potassium carbonate, and 55 mL of DMAc were used. The polymer was obtained as a white powder, $T_g$ 291° C. by DSC.

EXAMPLE 15

This example describes the preparation of a polymer with repeat unit (M). To a 250 ml round bottom flask was added 10.2 g (0.0354 mol) of 4,4'-(1-phenylethylidene) bisphenol, 11.6 g (0.0347 mol) of decafluorobiphenyl, 12 g of potassium carbonate, and 135 g of DMAc. The mixture was heated to 80° C. under nitrogen with stirring for 16 hours. The mixture was allowed to cool to room temperature and poured into water to precipitate the polymer. The polymer was filtered, washed with water, and dried. Two grams of the polymer were dissolved in 8 g of a mixture of 2-ethoxy ethyl ether and cyclohexanone (ratio 8:2, respectively) and spin coated onto a glass substrate, and dried 15 min at 100° C., 15 min at 200° C., and 15 min at 400° C. to yield a flexible, transparent film. The polymer had a $T_g$ of 208° C. by DSC and a dielectric constant of 2.64 at 0% RH.

EXAMPLE 16

This example describes the preparation of a copolymer having repeat units (A) and (O), in a molar ratio of 1:4. To a 100 mL round bottom flask was added 3.75 g (0.021 mol) of 4,6-dichlororesorcinol, 1.76 g (0.0053 mol) of 6F-diphenol, 8.80 g (0.026 mol) of decafluorobiphenyl, 62 g of DMAc, and 10 g of potassium carbonate. The mixture was heated under nitrogen for 8 hours at 110° C. The mixture was poured without cooling into water to precipitate the polymer. The polymer was collected by filtration, washed with water, and dried to yield a light pink powder. The polymer had a $T_g$ of 149° C. by DSC.

EXAMPLE 17

This example describes the preparation of a polymer (referred to hereinafter as BPA-DFB) from 4,4'-isopropylidenediphenol and decafluorobiphenyl: The reaction of Example 1 was repeated except that 10.20 g of 4,4'-isopropylidenediphenol ("Bisphenol A") was used in place of the 6F-diphenol. 21.5 g of polymer was obtained from the reaction. A film of the polymer had a bulk moisture absorption of 0.2% after immersion in 50° C. water for 16 hours.

EXAMPLE 18

This example describes a general procedure for the preparation of bistriazene compounds of our invention. Bistriazenes A-I in Table I below were prepared by this procedure.

A solution of diamine (40 mmol)

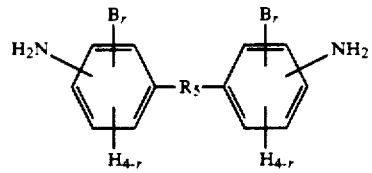

where $—R_d—$, $—B$, and r are as previously defined, was prepared, with tetrahydrofuran (THF, 400 mL) as the solvent. (Methanol was used in the case of bistriazene B.) The solution was transferred into a 1-liter, 3-neck round bottom flask equipped with a mechanical stirrer, thermometer, and addition funnel. A solution of 12N hydrochloric acid (24 mL, 288 mmol) in water (300 mL) was poured in slowly, with vigorous stirring. After 5 min, the contents of the flask were chilled to −5° C. with continued stirring. A solution of sodium nitrite (11.0 g, 159.4 mmol) in ice-water (150 mL) was added to the chilled contents over a period of 30 min through the addition funnel. Stirring was continued for an additional 60 min, maintaining the temperature below 0° C. At the end of this period, the THF was removed under reduced pressure at 25° C. The remaining aqueous material was cooled to 0° C. and neutralized to pH 6-7 with saturated sodium carbonate solution. The neutralized solution was immediately poured into a 2-liter beaker containing a freshly prepared solution of dimethylamine hydrochloride (16.3 g, 200 mmol) (for bistriazenes H and I, diethylamine and aniline were used, respectively) and sodium carbonate (33.9 g, 320 mmol) in ice-water (450 mL). The mixture was stirred vigorously with a mechanical stirrer for 20 min and then extracted with dichloromethane (4×80 mL). The combined extracts were dried over anhydrous magnesium sulfate and decolorized with activated charcoal. The dichloromethane was removed under reduced pressure at 35° C. The residue was recrystallized from dichloromethane-acetone (1/5 v/v). The yields, melting points, and decomposition temperatures of various bistriazenes are provided in Table I. Table II provides their spectral characteristics.

TABLE I

Yield, Melting Point, and Decomposition Temperature of Bistriazene Compounds

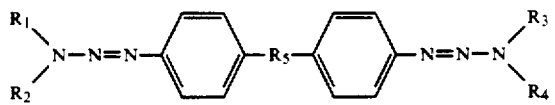

| Ref. | —R₅— | R₁-R₄ | Yield (%)* | M. p. (°C.) | $T_d$ (°C.)** |
|---|---|---|---|---|---|
| 1 | —O— | R₁-R₄ = Me | 58.6 | 53-5 | 268.5 |
| 2 | —SO₂— | R₁-R₄ = Me | 48.4 | 209-11 | 290.3 |
| 3 | —O—⌬—O— | R₁-R₄ = Me | 91.2 | 140-43 | 277.0 |
| 4 | —O—⌬—⌬—O— | R₁-R₄ = Me | 76.5 | 167-69 | 263.0 |
| 5 | —O—⌬—SO₂—⌬—O— | R₁-R₄ = Me | 56.8 | 159-60 | 288.8 |
| 6 | —O—⌬—C(CH₃)₂—⌬—O— | R₁-R₄ = Me | 62.6 | 74-6 | 279.4 |
| 7 | —O—⌬—C(CF₃)₂—⌬—O— | R₁-R₄ = Me | 68.0 | 125-28 | 282.8 |
| 8 | —O—⌬—⌬—O— | R₁-R₄ = Et | 67 | 105-8 | 350 |
| 9 | —O—⌬—⌬—O— | R₁, R₃ = H; R₂, R₄ = Ph | 61 | 155-57 | 180 |

*Yield not optimized
**Decomposition temperature measured by DSC (10° C./min)

TABLE II

Spectral Characteristics of Bistriazene Compounds

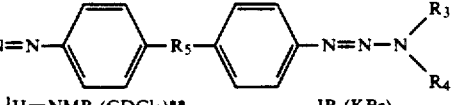

| Ref. (*) | ¹H—NMR (CDCl₃)** δ(ppm) | Assignment | IR (KBr) cm⁻¹ | Assignment |
|---|---|---|---|---|
| 1 | 3.30 (s, 12H) | —N—CH₃ | 1585 (w) | conj. C=C |
|   | 6.91-7.60 (m, 8H) | Ar—H | 1492 (s) | N=N |
|   |  |  | 1231 (s) | C—O—C |
|   |  |  | 1083 (s) | C—N |
| 2 | 3.32 (s, 12H) | —N—CH₃ | 1476 (m) | N=N |
|   | 7.40-8.10 (m, 8H) | Ar—H | 1289 (s) | O=S=O |
|   |  |  | 1148 (s) | O=S=O |
|   |  |  | 1108 (s) | C—N |
| 3 | 3.29 (s, 12H) | —N—CH₃ | 1448 (s) | N=N |
|   | 6.82-7.48 (m, 12H) | Ar—H | 1222 (s) | C—O—C |
|   |  |  | 1084 (s) | C—N |
| 4 | 3.32 (s, 12H) | —N—CH₃ | 1492 (s) | N=N |
|   | 6.86-7.66 (m, 8H) | Ar—H | 1250 (s) | C—O—C |

TABLE II-continued

Spectral Characteristics of Bistriazene Compounds

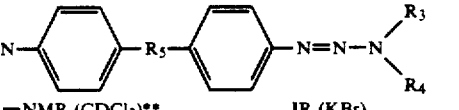

| Ref. (*) | ¹H—NMR (CDCl₃)** δ(ppm) | Assignment | IR (KBr) cm⁻¹ | Assignment |
|---|---|---|---|---|
|   |  |  | 1076 (s) | C—N |
| 5 | 3.29 (s, 12H) | —N—CH₃ | 1486 (s) | N=N |
|   | 6.81-8.02 (m, 16H) | Ar—H | 1295 (m) | O=S=O |
|   |  |  | 1189 (s) | O=S=O |
|   |  |  | 1239 (s) | C—O—C |
|   |  |  | 1104 (s) | C—N |
| 6 | 1.61 (s, 6H) | —C—CH₃ | 1493 (m) | N=N |
|   | 3.29 (s, 12H) | —N—CH₃ | 1246 (s) | C—O—C |
|   | 6.72-7.53 (m, 16H) | Ar—H | 1078 (s) | C—N |
| 7 | 3.30 (s, 12H) | —N—CH₃ | 1495 (s) | N=N |
|   | 6.82-7.53 (m, 16H) | Ar—H | 1247 (s) | C—O—C |
|   |  |  | 1198 (s) | C—F |
|   |  |  | 1086 (s) | C—N |

TABLE II-continued
Spectral Characteristics of Bistriazene Compounds $$R_1\diagdown_{\phantom{/}}N-N=N-\bigcirc-R_5-\bigcirc-N=N-N\diagup^{R_3}_{\phantom{\diagdown}R_4}$$
$$R_2\diagup\phantom{N-N=N-\bigcirc-R_5-\bigcirc-N=N-N}\diagdown R_4$$

| Ref. (*) | $^1$H—NMR (CDCl$_3$)** δ(ppm) | Assignment | IR (KBr) cm$^{-1}$ | Assignment |
|---|---|---|---|---|
| 8 | 1.43 (t, 12H) | CH$_3$ | 1600 | conj. C=C |
|   | 3.90 (q, 8H) | N—CH$_2$ | 1495 | N=N |
|   | 6.90–7.89 (m, 16H) | Ar—H | 1240 | C—O—C |
|   |   |   | 1087 | C—N |
| 9 | 6.87–7.63 (m) | Ar—H | 3296 (w) | s-amine |
|   |   |   | ~3035 (w) | Ar-H |
|   |   |   | 1599 (m) | conj. C=C |
|   |   |   | 1500 (s) | N=N |
|   |   |   | 1246 (s) | C—O—C |
|   |   |   | 1100 (s) | C—N |

*See Table I
**Acetone-d$_6$ for compound H; DMSO-d$_6$ for compound I

EXAMPLE 19

This example describes the deposition of layers of polymer (D), crosslinked with a bistriazene crosslinking agent. A solution of polymer (D) (about 23 weight percent solids) in a solvent system of 1:1:1 bis(2-ethoxy ethyl)ether, DMAc, and 5-methyl-2-hexanone (W/W/W) was prepared. To this was added 16.7 weight % of the bistriazene

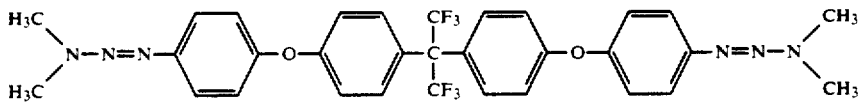

This solution was then coated onto a substrate (ceramic or silicon) by spin coating. The coated substrate was heated in a nitrogen purged oven having a conveyor belt which ran the substrate through the oven according to a temperature profile of 300° C. for 6.5 min, 400° C. for 13.5 min, and then cooling to room temperature over 20 min. This procedure produced a clear coating of crosslinked polymer (D) which did not crack upon subsequent processing (e.g., during the deposition of additional polymer layers) and did not cause oxidation of metal conductors thereon.

It was found that, to improve the adhesion of the crosslinked polymer (D) to the substrate, it is desirable to use a thin layer (about 1μ thick) comprising acetylene terminated polyimide (Thermid IP-615) and γ-aminopropyltrimethoxysilane coupling agent, between polymer (D) and the substrate as an adhesion promoting interlayer. The polyimide/coupling agent layer is deposited onto the substrate and cured at 150° C. for 10 min and then 200° C. for 15 min. The polymer (D) layer is then coated on top and cured as described above.

EXAMPLE 20

This example describes the various steps of metallization, patterning, etching, and via formation on a substrate coated with polymer (D) as described in the previous example.

Metal conductor traces were deposited on a cured polymer (D) coating by sputtering. The conductor was a chromium-copper-chromium sandwich, with 200 Å thick layers of chromium acting as tie-down layers for the copper (5μ thick). This conductor construction is preferable to the more conventional aluminum, which does not adhere as well to crosslinked polymer (D).

The metal was covered with a photoresist, which was then covered with a mask and exposed to ultraviolet light. The exposed portions of the photoresist were removed by washing with sodium hydroxide solution, leaving portions of the metal exposed. The exposed metal was removed by etching with CRE-473 (tradename for a hydrochloric acid etchant, available from Transene) and ferric chloride to remove respectively the top chromium layer and the copper layer. The bottom chromium layer was etched away with CE 8001-N (tradename for a ceric ammonium nitrate-nitric acid etchant, available from Chemtech Industries). Laser ablation can also be used for removing the bottom chromium layer, but CE 8001-N is preferred because it is faster and less harsh on the polymer.

After etching of the metal, the unexposed photoresist was removed by flooding the entire substrate wafer with ultraviolet light and developing off the remaining photoresist with sodium hydroxide. An alternative method is to strip off undeveloped photoresist with a 7:3:1 (V/V/V) mixture of NMP, deionized water, and methanol.

The patterned metal is overcoated with more crosslinked polymer (D). A metal layer or via mask about 3μ thick is sputtered onto the polymer coating and photolithographically patterned as described above, to form holes in the metal where vias are desired. The entire wafer was ablated with a 308 nm laser, with polymer being removed wherever there was a hole in the metal until bottom metal was reached. The mask was then removed by etching. (To avoid etching the metal conductors along with the via mask, the via mask should be made of different, selectively etchable metal, such as aluminum).

Using the above procedures, a substrate wafer carrying a plurality of multilayer units was prepared. This substrate and the units thereon is shown schematically in FIGS. 4 and 4a-b (where like numerals depict like elements). Substrate 40 has thereon a plurality of multilayer units 41 (also shown in magnified overhead and crosssection views in FIGS. 4a and 4b, respectively). Each unit 41 has layers of metal conductors 43a and 43b isolated by a dielectric 42 of crosslinked polymer (D). Vias 44a and 44b provide interlayer connectivity. Each unit 41 can be viewed as a parallel plate capacitor. Twenty units 41 were tested by measuring their capacitances. Each had a capacitance which agreed with that predicted by the equation $$C = D\epsilon_0 A/L$$

where C is the capacitance, D is the dielectric constant of the polymer interlayer, $\epsilon_0$ is the permittivity of free space, A is the area of the capacitor plates, and L is the distance separating the capacitor plates. (The distance between the capacitor plates (i.e., the layers of conductors) was determined to be 35μ by scanning electron microscopy.)

EXAMPLE 21

In this example, the dielectric properties of polymer (D) crosslinked with a bistriazene in the manner of Example 19 are compared with those of a benzocyclobutene ("BCB") resin (XU13005.02L available from Dow Chemical Company), proposed as a dielectric for electronic packaging applications. Capacitors were made from crosslinked polymer (D) and the BCB resin according to the procedure of Example 20. The capacitances of strips of five capacitors of made from each polymer were measured as a function of % RH, before and after aging. The results are provided in Table III.

TABLE III

Comparison of Aging Effects on Dielectric Constant of BCB XU13005.02L and Bistriazene Crosslinked Polymer D

| Aging in air @ 200° C. (hrs) | % RH | Dielectric Constant | % RH | Dielectric Constant |
| --- | --- | --- | --- | --- |
| 0 | 0 | 2.485 | 0 | 2.656 |
|   | 21 | 2.494 | 30 | 2.690 |
|   | 42 | 2.503 | — | — |
|   | 78 | 2.522 | 69 | 2.734 |
| 24 | 0 | 2.747 | 0 | 2.623 |
|   | 34 | 2.817 | 34 | 2.662 |
|   | 71 | 2.897 | 71 | 2.702 |
| 96 | 0 | 2.891 | 0 | 2.649 |
|   | 33 | 3.008 | 33 | 2.687 |
|   | 76 | 3.152 | 76 | 2.737 |
| 336 | 0 | 3.198 | 0 | 2.614 |
|   | 28 | 3.401 | 30 | 2.635 |
|   | 62 | 3.603 | 73 | 2.673 |

These results show that the dielectric properties of crosslinked polymer (D) compare favorably to those of the BCB resin. Although the BCB resin has a lower initial dielectric constant, upon exposure to elevated temperatures, as might occur in the course of the normal service life of an electronic article, the BCB resin's dielectric constant increases at a fairly sharp rate, with the increase being particularly noticeable at high % RH's. In contrast, the dielectric constant of polymer (D) remains low, below 2.8 at all aging time-relative humidity combinations.

EXAMPLE 22

This example describes the preparation of another bistriazene crosslinking agent of this invention, having the structure

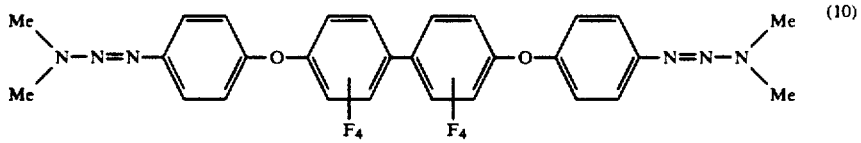

(10)

To a solution of 8 g (15.6 mmol) of 4,4'-bis(4-aminophenoxy)decafluorobiphenyl in 160 mL of THF in a 500 mL three-neck flask equipped with a mechanical stirrer, a thermometer, and an addition funnel, solution of 9.1 mL (109.2 mmol) 12N hydrochloric acid in 80 mL of water was added slowly. The resulting mixture was chilled to −5° C. with constant stirring. A solution of 4.32 g (62.4 mmol) sodium nitrite in 50 mL of ice water was added to this chilled mixture dropwise over a period of 30 min with vigorous stirring. During the addition, the temperature of the reaction mixture did not exceed −3° C. After the addition, the reaction mixture was stirred below 0° C. for an additional 60 min. At the end of the reaction, the organic solvent was removed under reduced pressure at 25° C. The resulting aqueous solution was chilled to 0° C. and neutralized to pH 6–7 with a saturated solution of sodium carbonate. The neutralized solution was immediately poured into a 1 L beaker containing a freshly prepared solution of 6.37 g of dimethylamine hydrochloride and 13.24 g of sodium carbonate in 150 mL of water with vigorous stirring. After an additional 10 minutes of stirring, the reaction mixture was extracted with four 50 mL portions of dichloromethane. The combined extracts were washed with two 50 mL portions of water, dried over anhydrous magnesium sulfate, and decolorized with activated charcoal. The solvent was then removed under reduced pressure at 35° C. and the residue redissolved in the minimum amount of acetone. To the acetone solution was added 100 mL of pentane with stirring. The precipitate was filtered, washed with more pentane, and vacuum dried to yield 5.96 g (61.2%) of bistriazene, mp 133°–35° C.

EXAMPLE 23

A bistriazene having the structure

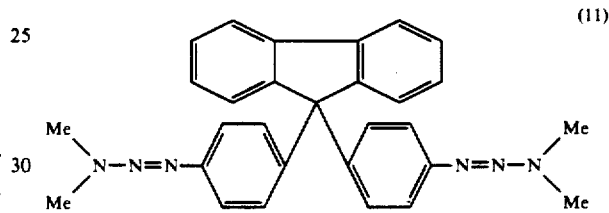

(11)

was prepared following the procedure and stoichiometric ratios of Example 21, using 5.44 g (15.6 mmol) of 9,9-bis(4-aminophenyl)fluorene. The yield was 5.50 g (76.6%), mp 197°–99° C.

EXAMPLE 24

A bistriazene having the structure

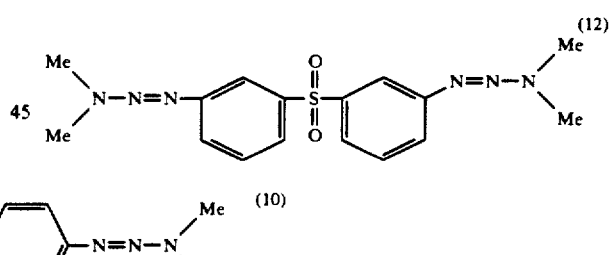

(12)

was prepared following the procedure and stoichiometric ratios of Example 21, except as noted below, using 7.75 g (31.2 mmol) of 3-aminophenyl sulfone which had been purified by decolorization with activated charcoal and recrystallization from THF. After the dichloromethane extraction step, the solvent was evaporated and the residue was redissolved in the minimum of acetone. To the acetone solution was added 100 mL of methanol, with stirring. The precipitate was filtered, washed with methanol, air dried, and then vacuum dried to yield 5.16 g (45.7%) of bistriazene, mp 120°–25° C.

EXAMPLE 25

In this example, the crosslinking of a variety of fluorinated poly(arylene ethers) by a variety of bistriazene crosslinking agents is illustrated.

A sample of fluorinated poly(arylene ether) (2 g) was combined in a 30 mL vial with cyclohexanone (4 g), γ-butyrolactone (4 g), bistriazene compound (ca. 0.4 g) and a surfactant (Fluorad FC-431 from 3M, 2 drops). The mixture was stirred until all the solids had dissolved. The solution was allowed to sit until all bubbles formed by agitation had dispersed. A majority of the solution was deposited on a ceramic substrate and spin coated at 250 rpm to form a thick coating. The sample was soft-baked at 100° C. for 15 min, then at 200° C. for another 15 min. The sample was then baked in a nitrogen-purged zone furnace according to the following cycle: 300° C. for 6.5 min, 400° C. for 13.5 min, and room temperature for 20 min, to yield a sample of approximately 1.5 g.

This cured sample was removed from the ceramic substrate and divided into three equal sections. Each section was cut into small pieces and placed inside a pre-weighed gauze tube. The gauze tube was sealed and re-weighed. All three sections were placed inside a Soxhlet extraction apparatus and extracted with DMAc for 24 hr. After drying in a vacuum oven at 100° C. overnight, the samples were cooled and weighed again to determine the gel content. The results provided in Table IV show that bistriazene compounds are generally effective crosslinking agents for fluorinated poly(arylene ethers):

TABLE IV

Crosslinking of Fluorinated Poly(arylene Ethers) by Bistriazene Compounds

| Fluorinated Poly-(arylene ether) | Bistriazene Compound | Amount Bistriazene Compound (wt %) | Percent Gel |
|---|---|---|---|
| D | none | 0.00 | 3.3 ± 0.2 |
| D | 4 | 4.76 | 64.1 ± 0.8 |
| D | 4 | 9.1 | 78.8 ± 1.0 |
| D | 4 | 13.04 | 86.4 ± 2.7 |
| D | 4 | 16.67 | 93.7 ± 2.2 |
| D | 7 | 4.76 | 46.6 ± 2.4 |
| D | 7 | 9.1 | 62.5 ± 2.4 |
| D | 7 | 13.04 | 68.6 ± 1.6 |
| D | 7 | 16.67 | 86.6 ± 2.6 |
| D | 3 | 9.1 | 87.1 ± 5.8 |
| D | 3 | 16.67 | 94.9 ± 0.7 |
| D | 10 | 16.67 | 81.2 ± 2.1 |
| D | 11 | 16.67 | 85.7 ± 0.5 |
| D | 12 | 16.67 | 52.9 ± 2.2 |
| A | none | 0.00 | 0.8 ± 0.8 |
| A | 7 | 16.67 | 65.3 ± 2.9 |

EXAMPLE 26

This example describes the preparation of a polymer with the repeat unit (M'). To a 100 mL round bottom flask was added 3.21 g (0.0093 mol) Bisphenol P, 3.12 g (0.00934 mol) decafluorobiphenyl, 4.2 g of potassium carbonate, and 22 g DMAc. The reaction mixture was heated at 100° C. for 6 hours under nitrogen with stirring. The polymer was isolated as described in Example 5 to yield a white powder. The polymer had a $T_g$ of 162° C. by DSC. A film of the polymer had a dielectric constant of 2.58 at 0% RH and 2.71 at 66.45% RH.

EXAMPLE 27

This example describes the preparation of the copolymer having repeat units (A) and (O). To a 100 mL round bottom flask was added 3.75 g (0.026 mol) of 4,6-dichlororesorcinol, 1.76 g (0.0052 mol) of 6F-diphenol, 10.45 g (0.031 mol) of decafluorobiphenyl, 12 g potassium carbonate, and 39 g of DMAc. The reaction mixture was heated to 110° C. for 8 hours under nitrogen with stirring. The gelled reaction mixture was allowed to cool to room temperature and added to water and digested in a blender to isolate an off-white powder. The powder was washed with water and dried. The polymer had a $T_g$ of 149° C. by DSC.

EXAMPLE 28

This example describes the preparation of the copolymer having repeat units (A) and (P). To a 100 mL round bottom flask was added 5.70 g (0.017 mol) of decafluorobiphenyl, 1.34 g (0.0083 mol) of 2,7-dihydroxynaphthalene, 2.82 g (0.0083 mol) of 6F-diphenol. The reaction mixture was heated to 90° C. for 18 hours under nitrogen with stirring and allowed to cool to room temperature. The polymer was isolated by the procedure described in Example 5 to yield a white powder. The polymer had a $T_g$ of 190° C. by DSC. A film of the polymer had a dielectric constant of 2.54 at 0% RH and 2.64 at 65.4% RH.

EXAMPLE 29

This example describes the preparation of the copolymer having repeat units (A) and (Q). The procedure described in the Example immediately above was repeated except that 1.34 g (0.0083 mol) of 1,5-dihydroxynaphthalene was used instead of 2,7-dihydroxynaphthalene. An off white powder was obtained. The polymer had a $T_g$ of 203° C. by DSC.

EXAMPLE 30

This example describes the preparation of a copolymer having repeat units (D) and (Q) and its subsequent crosslinking with a peroxide. To a 250 mL round bottom flask was added 3.32 g (0.0207 mol) of 1,5-dihydroxynaphthalene, 7.26 g (0.0207 mol) of 9,9-bis(4-hydroxyphenyl)fluorene, 14.22 g (0.0427 mol) of decafluorobiphenyl, 17 g of potassium carbonate, and 127 g of DMAc. The mixture was heated to 85° C. for 16 hr under nitrogen with stirring and then poured while still hot into a blender containing 300 mL of water to precipitate the polymer. The polymer was collected by filtration and washed twice more with 300 mL of water and dried. Two grams of polymer and 0.22 g of dicumyl peroxide were dissolved in 8.5 g of a 1:1 mixture of γ-butyrolactone and cyclohexanone. The solution was spin coated onto a ceramic substrate and cured as follows: 30 min/130° C., heat to 400° C. at a rate of 5° C./min, hold at 400° C. for 15 min, and cool to room temperature at a rate of 3° C./min. A amber film was obtained, which did not stress crack or dissolved when exposed to the aforementioned γ-butyrolactone-cyclohexanone mixture. A control film of the copolymer, similarly heated under nitrogen but without the added of dicumyl peroxide, showed solvent induced stress cracking when exposed to the same solvent mixture.

We claim:
1. A composition comprising:
   (i) a fluorinated poly(arylene ether) comprising a repeat unit of the structure

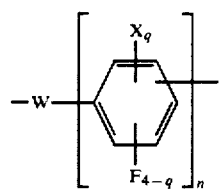

wherein —W— is

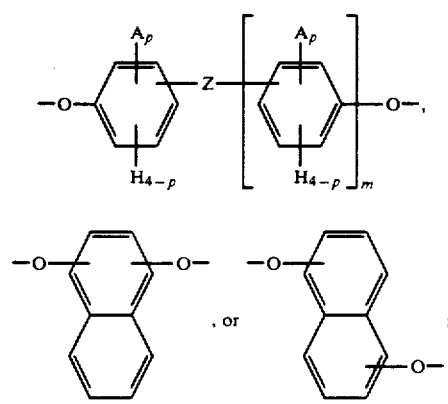

wherein independently each —A is —CH$_2$CH=CH$_2$ or —A is —F, —Cl, —Br, —CF$_3$, —CH$_3$, or —C$_6$H$_5$; p is 0, 1, or 2; —Z— is a direct bond or —Z— is —C(CH$_3$)$_2$—, —C(CF$_3$)$_2$—, —O—, —S—, —SO$_2$—, —CO—, —P(C$_6$H$_5$)—, C(CH$_3$)(C$_6$H$_5$), —C(C$_6$H$_5$)$_2$—, —(CF$_2$)$_{1-6}$—, or

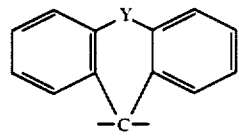

wherein —Y— is —O— or —Y— is a direct bond; and m is 0, 1, or 2; independently each —X is —CH$_2$CH=CH$_2$ or —X is —H, —Cl, —Br, —CF$_3$, —CH$_3$, or —C$_6$H$_5$; q is 0, 1, or 2; and n is 1 or 2; and (ii) a bistriaze compound of the formula

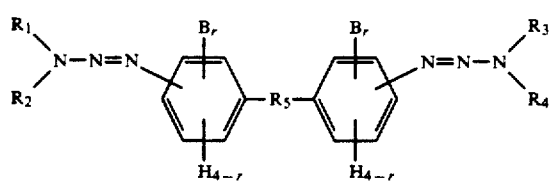

wherein —R$_1$, —R$_2$, —R$_3$, and —R$_4$ are independently —H, —C$_6$H$_5$, —C$_6$H$_4$Y', or C$_1$-C$_4$ alkyl; —R$_5$— is —O—, —SO$_2$—,

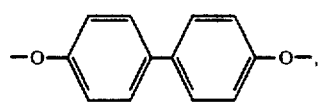

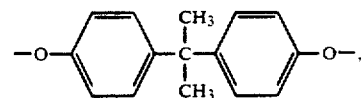

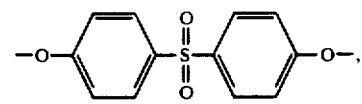

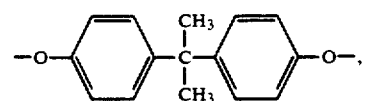

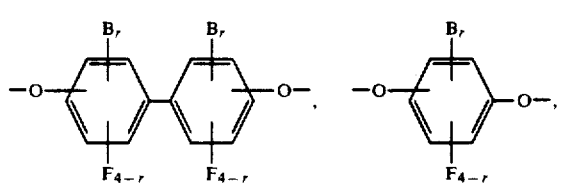

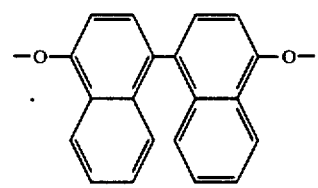

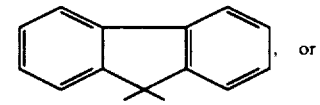

—B is —F, —Cl, —Br, —CH$_3$, or —CF$_3$; r is 0,1,2,3, or 4; and —Y' is halogen, —NO$_2$, —C$_6$H$_5$, or C$_1$-C$_4$ alkyl; bistriazene compound (ii) being present in an amount effective to crosslink fluorinated poly(arylene ether) (i).

2. A composition according to claim 1, wherein —W— is

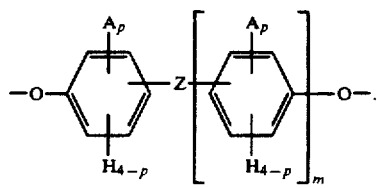

3. A composition according to claim 1, wherein —W— is

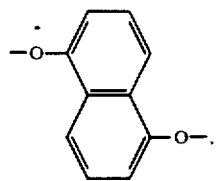

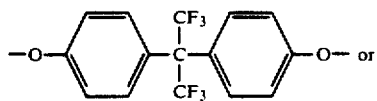

4. A composition according to claim 1, wherein

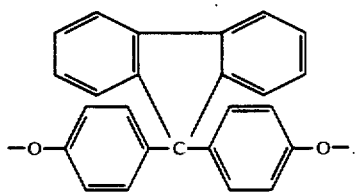

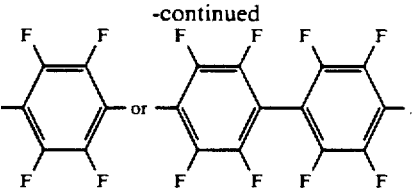

5. A composition according to claim 1, wherein fluorinated poly(arylene ether) (i) comprises a repeat unit of the structure

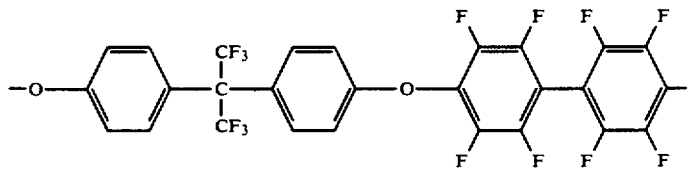

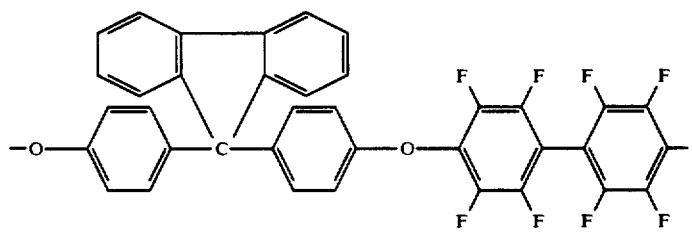

6. A composition according to claim 1 or 5, wherein in bistriazene compound (ii) —R$_5$— is

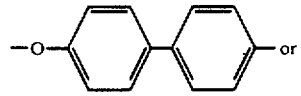

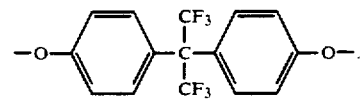

7. A composition according to claim 6, wherein each of —R$_1$, —R$_2$, —R$_3$ and —R$_4$ is methyl and r is 0.

8. A composition according to claim 6, wherein bistriazene compound (ii) has the structure

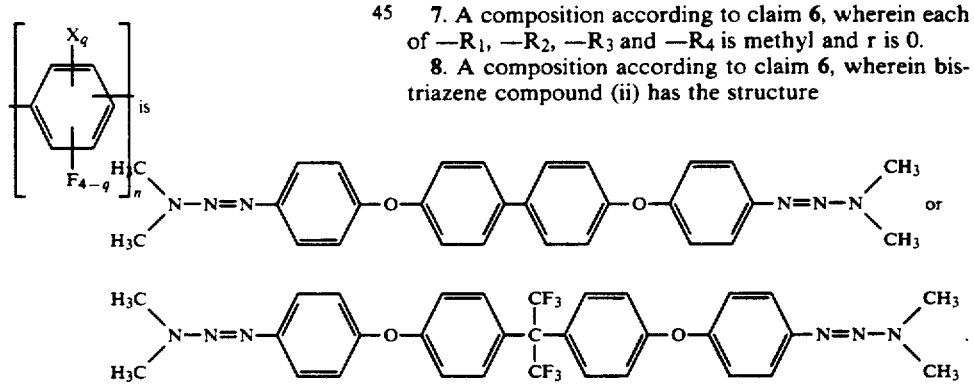

9. A composition according to claim 1, wherein bistriazene compound (ii) is present in an amount of between about 10 and about 40 weight %, based on the combined weights of fluorinated poly(arylene ether) (i) and bistriazene compound (ii).

10. A crosslinked composition produced by heating the composition of claim 1 to a temperature between about 300° and about 400° C.

11. A method of crosslinking a fluorinated poly(arylene ether), comprising the steps of:

(i) forming an intimate mixture of a fluorinated poly(arylene ether) comprising a repeat unit of the structure

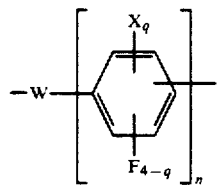

wherein —W— is

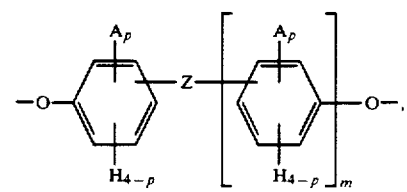

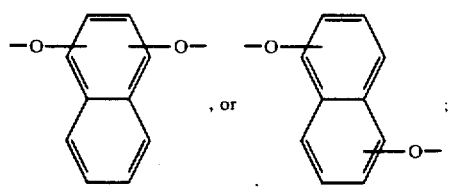

wherein independently each —A is —CH$_2$CH=CH$_2$ or —A is —F, —Cl, —Br, —CF$_3$, —CH$_3$, or —C$_6$H$_5$; p is 0, 1, or 2; —Z— is a direct bond or —Z— is —C(CH$_3$)$_2$—, —C(CF$_3$)$_2$—, —O—, —S—, —SO$_2$—, —CO—, —P(C$_6$H$_5$)—, C(CH$_3$)(C$_6$H$_5$), —C(C$_6$H$_5$)$_2$—, —(CF$_2$)$_{1-6}$—, or

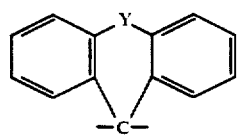

wherein —Y— is —O— or —Y— is a direct bond; and m is 0, 1, or 2; independently each —X is —CH$_2$CH=CH$_2$ or —X is —H, —Cl, —Br, —CF$_3$, —CH$_3$, or —C$_6$H$_5$; q is 0, 1, or 2; and n is 1 or 2; and a bistriazene crosslinking agent of the formula

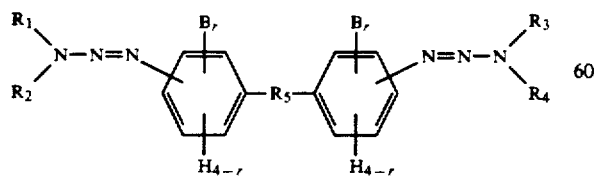

wherein —R$_1$, —R$_2$, —R$_3$, and —R$_4$ are independently —H, —C$_6$H$_5$, —C$_6$H$_4$Y', or C$_1$-C$_4$ alkyl; —R$_5$— is —O—, —SO$_2$—,

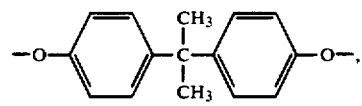

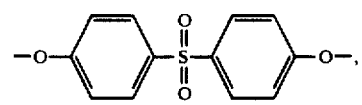

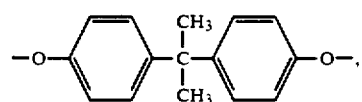

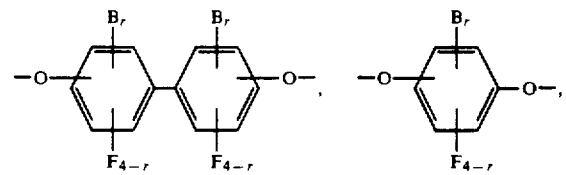

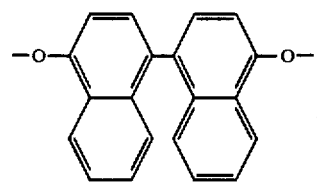

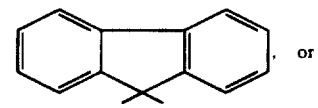

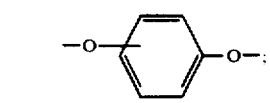

—B is —F, —Cl, —Br, —CH$_3$, or —CF$_3$; r is 0, 1, 2, 3, or 4; and —Y' is halogen, —NO$_2$, —C$_6$H$_5$, or C$_1$-C$_4$ alkyl; the bistriazene compound being present in an amount effective to crosslink the fluorinated poly(arylene ether);

(ii) forming a shaped body from the mixture of fluorinated poly(arylene ether) and bistriazene compound and removing any solvent present; and (iii) heating the shaped body to a temperature above the decomposition temperature of the bistriazene compound, thereby effecting the crosslinking of the fluorinated poly(arylene ether).

12. A method according to claim 11, wherein in the fluorinated poly(arylene ether) —W— is

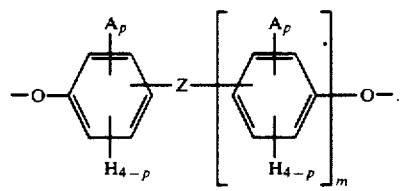

13. A method according to claim 11, wherein —W— is

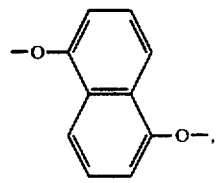

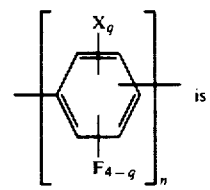

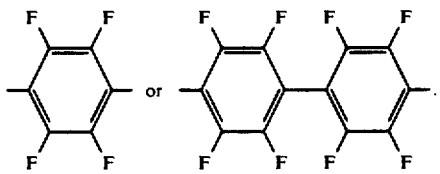

15. A method according to claim 11, wherein the fluorinated poly(arylene ether) comprises a repeat unit of the structure

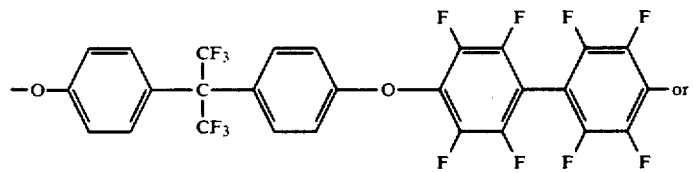

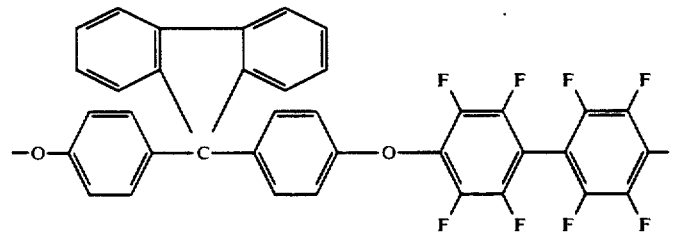

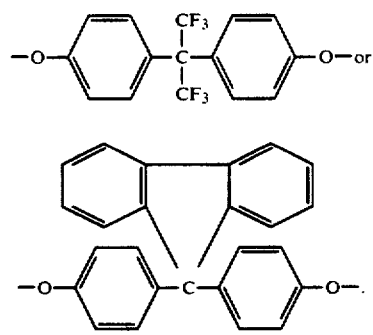

14. A method according to claim 11, wherein in the fluorinated poly(arylene ether)

16. A method according to claim 11 or 15, wherein in the bistriazene crosslinking agent —R$_5$— is

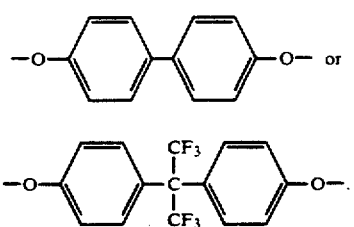

17. A method according to claim 16, wherein in the bistriazene crosslinking agent each of —R$_1$, —R$_2$, —R$_3$ and —R$_4$ is methyl and r is 0.

18. A method according to claim 16, wherein the bistriazene crosslinking agent has the structure

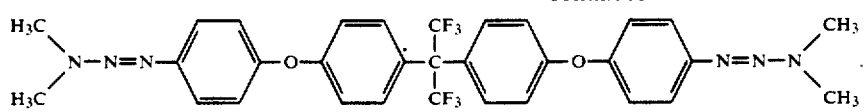

19. A method according to claim 11, wherein in the intimate mixture formed in step (i), the bistriazene crosslinking agent is present in an amount between about 10 and about 40 weight %, based on the combined weights of the fluorinated poly(arylene ether) and the bistriazene compound.

20. A method according to claim 11, wherein in step (iii) the shaped article is heated to a temperature between about 300° and about 400° C.

21. A method according to claim 11, wherein the intimate mixture of step (i) is formed by solution mixing.